US011125797B2

(12) United States Patent
Kang et al.

(10) Patent No.: US 11,125,797 B2
(45) Date of Patent: Sep. 21, 2021

(54) SIGNAL GENERATOR AND A MEASUREMENT SYSTEM INCLUDING SIGNAL GENERATOR

(71) Applicant: Korea Research Institute of Standards and Science, Daejeon (KR)

(72) Inventors: No Weon Kang, Daejeon (KR); Jeongil Park, Daejeon (KR)

(73) Assignee: Korea Research Institute of Standards and Science, Daejeon (KR)

(*) Notice: Subject to any disclaimer, the term of this patent is extended or adjusted under 35 U.S.C. 154(b) by 224 days.

(21) Appl. No.: 16/387,449

(22) Filed: Apr. 17, 2019

(65) Prior Publication Data
US 2019/0310299 A1 Oct. 10, 2019

Related U.S. Application Data

(63) Continuation of application No. PCT/KR2016/013052, filed on Nov. 14, 2016.

(51) Int. Cl.
*G01R 29/08* (2006.01)
*G01R 27/32* (2006.01)
(Continued)

(52) U.S. Cl.
CPC ......... *G01R 29/0892* (2013.01); *G01R 27/32* (2013.01); *G01R 29/08* (2013.01);
(Continued)

(58) Field of Classification Search
CPC .... G01R 29/0892; G01R 29/08; G01R 29/10; G01R 29/0878; G01R 29/0871; G01R 31/28; G01R 31/2839; G01R 27/32
(Continued)

(56) References Cited

U.S. PATENT DOCUMENTS 3,879,733 A * 4/1975 Hansen .................. G01R 29/10
342/360
6,160,491 A * 12/2000 Kitao ..................... G08C 19/28
340/12.28
(Continued)

FOREIGN PATENT DOCUMENTS

JP 11-264736 9/1999
JP 2012-007997 A 1/2012
(Continued)

OTHER PUBLICATIONS

The Oscilloscope and the Function Generator: Some introductory exercises for students in the advanced labs. (Year: 2007).*
(Continued)

*Primary Examiner* — Christopher P McAndrew
(74) *Attorney, Agent, or Firm* — Central California IP Group, P.C.; Andrew D. Fortney (57) ABSTRACT

A measurement system according to an embodiment of the present invention comprises: an analyzer; a first expansion module for transmitting a first electromagnetic wave signal to a first antenna under control of the analyzer; a second expansion module for receiving a second electromagnetic wave signal through a second antenna; a first signal generator for generating a first local oscillation signal under control of the analyzer, and detecting a reference characteristic of the first electromagnetic wave signal and a first test characteristic of the first antenna by using the first local oscillation signal; and a second signal generator for generating a second local oscillation signal under control of the analyzer, and detecting a second test characteristic of the second antenna by using the second local oscillation signal, wherein the first signal generator comprises a controller for converting instructions transmitted from the analyzer into internal instructions, and a local oscillation signal generator for generating the first local oscillation signal according to the internal instructions.

20 Claims, 8 Drawing Sheets

(51) Int. Cl.
*G01R 31/28* (2006.01)
*G01R 29/10* (2006.01)

(52) U.S. Cl.
CPC ......... *G01R 29/0878* (2013.01); *G01R 29/10* (2013.01); *G01R 31/28* (2013.01)

(58) Field of Classification Search
USPC .................................................. 324/750.03
See application file for complete search history.

(56) References Cited

U.S. PATENT DOCUMENTS

| | | | | |
|---|---|---|---|---|
| 6,582,105 | B1* | 6/2003 | Christensen | B60Q 1/2657 340/12.5 |
| 7,095,456 | B2* | 8/2006 | Nakajima | G08C 19/28 348/734 |
| 7,821,582 | B2* | 10/2010 | Sato | H04N 5/775 348/734 |
| 8,385,474 | B2* | 2/2013 | Lee | H03L 7/081 375/326 |
| 8,446,976 | B2* | 5/2013 | Lee | H03B 5/366 375/271 |
| 2002/0093341 | A1* | 7/2002 | Kobuchi | G01R 31/002 324/637 |
| 2004/0066182 | A1* | 4/2004 | Evers | G01R 23/14 324/76.23 |
| 2010/0238077 | A1* | 9/2010 | Cho | H01Q 3/267 343/703 |

FOREIGN PATENT DOCUMENTS

| | | |
|---|---|---|
| JP | 2016-186443 A | 10/2016 |
| KR | 10-2001-0063688 A | 7/2001 |
| KR | 20-2008-0005836 | 12/2008 |
| KR | 10-2009-0033627 A | 4/2009 |
| KR | 10-2009-0036844 A | 4/2009 |
| KR | 10-1052045 B1 | 7/2011 |

OTHER PUBLICATIONS

XYZs of Oscilloscopes Primer (Year: 2016).*
International Search Report; International Searching Authority/KR dated Jun. 22, 2017; International Application No. PCT/KR2016/013052; 3 pages; International Searching Authority/Korean Intellectual Property Office, Daejeon, Republic of Korea.

* cited by examiner

SIGNAL GENERATOR AND A MEASUREMENT SYSTEM INCLUDING SIGNAL GENERATOR

CROSS-REFERENCE TO RELATED APPLICATIONS

This application is a continuation of and claims priority to PCT/KR2016/013052 filed on Nov. 14, 2016, which claims priority to Korea Patent Application No. 10-2016-0147201 filed on Nov. 7, 2016, the entireties of which are both hereby incorporated by reference.

TECHNICAL FIELD

The present disclosure relates to wireless communications and, more particularly, to a signal generator associated with wireless communications and a measurement system including the signal generator.

BACKGROUND

Among wireless communications devices, an antenna is an essential for wireless communications. Conventionally, antennas are produced through mass production processes. Characteristics of mass-produced antennas may be different from each other, rather than being identical to each other. In order to tune peripheral circuits, using antennas, to characteristics of the antennas, a test may be performed to measure the characteristics of the antennas.

The characteristics of the antennas may include a reflection coefficient, a gain, radiation pattern, and the like. A vector network analyzer (VNA) may be used to measure the characteristics of the antennas. The VNA is connected to antennas through microwave/RF cables such as coaxial cables and measures characteristics of the antennas.

As distances between a location of the VNA and locations of the antennas are increased, lengths of the cables are also increased. When the lengths of the cables are increased, significantly large attenuation of an electromagnetic wave signal may occur in the cables. Accordingly, the VNA may not normally measure characteristics of the antennas.

SUMMARY

An aspect of the present disclosure is to provide a measurement system and a signal generator which assist a vector network analyzer (VNA) to analyze characteristics of antennas. In particular, an aspect of the present disclosure is to provide a signal generator and a measurement system which assist a vector network analyzer to analyze characteristics of antenna at low cost irrespective of a manufacturer of the vector network analyzer.

According to an aspect of the present disclosure, a measurement system includes an analyzer, a first expansion module for transmitting a first electromagnetic wave signal to a first antenna under control of the analyzer, a second expansion module for receiving a second electromagnetic wave signal through a second antenna, a first signal generator for generating a first local oscillation signal under control of the analyzer, and detecting a reference characteristic of the first electromagnetic wave signal and a first test characteristic of the first antenna by using the first local oscillation signal, and a second signal generator for generating a second local oscillation signal under control of the analyzer, and detecting a second test characteristic of the second antenna by using the second local oscillation signal. The first signal generator includes a controller for converting instructions, transmitted from the analyzer into internal instructions, and a local oscillation signal generator for generating the first local oscillation signal according to the internal instructions.

In some embodiments, the first signal generator may receive a reference signal from the analyzer, generate a reference local oscillation signal and a first test local oscillation signal based on the reference signal, and transmit the reference local oscillation signal and the first test local oscillation signal to the first expansion module.

In some embodiments, the first expansion module may mix the reference local oscillation signal with the first electromagnetic wave signal and output the mixed signal to the first signal generator as a reference intermediate frequency signal. The first signal generator may transmit the reference intermediate frequency signal to the analyzer.

In some embodiments, the first expansion module may transmit a direct current (DC) component of the reference local oscillation signal to the first signal generator as a reference detection signal. The first signal generator may adjust levels of the reference local oscillation signal and the first test local oscillation signal using the reference detection signal.

In some embodiments, the second expansion module may mix a signal that the first electromagnetic wave signal is reflected from the first antenna with the first test local oscillation signal and transmit a result of the mixing to the first signal generator as a first test intermediate frequency signal. The first signal generator may transmit the first test intermediate frequency signal to the analyzer.

In some embodiments, the first signal generator may receive a list of frequencies from the analyzer, stores the received list, and change frequencies of the reference local oscillation signal and the first test local oscillation signal into another frequency among frequencies, listed in the list, in response to a trigger signal transmitted from the analyzer.

In some embodiments, the trigger signal may be transmitted through an additional hardware signal line.

In some embodiments, the instructions may be transmitted through an Ethernet channel.

In some embodiments, the second signal generator may receive the reference signal from the first signal generator, generate a second test local oscillation signal based on the reference signal, and transmit the second test local oscillation signal to the second expansion module.

In some embodiments, the second expansion module may mix the second test local oscillation signal with the second electromagnetic signal and transmit a result of the mixing to the second signal generator as a second test intermediate frequency signal. The second signal generator may transmit the second test intermediate frequency signal to the analyzer.

In some embodiments, the second expansion module may transmit a direct current (DC) component of the second test local oscillation signal to the first signal generator as a test detection signal. The first signal generator may adjust a level of the second test local oscillation signal using the test detection signal.

In some embodiments, the second signal generator receives a list of frequencies from the first signal generator, stores the received list, and changes a frequency of the second test local oscillation signal into another frequency among the frequencies listed in the listed in response to a trigger signal transmitted from the first signal generator.

In some embodiments, the second signal generator may output the trigger signal to the analyzer when a change in the frequency and detection of characteristics of the second antenna are completed.

In some embodiments, the first signal generator may generate the electromagnetic wave signal based on the reference signal and transmit the electromagnetic signal to the first antenna through the first expansion module.

In some embodiments, the analyzer may transmit the electromagnetic wave signal to the second antenna through the first expansion module.

According to another aspect of the present disclosure, a signal generator includes a controller configured to convert commands, received through a first channel, into internal commands and a local oscillation signal generator configured to generate a local oscillation signal according to the internal commands and to change a frequency of the local oscillation signal in response to a trigger signal received through a second channel.

In some embodiments, the signal generator may further include a variable attenuator configured to adjust an attenuation rate of the local oscillation signal in response to a detection signal transmitted through a third channel.

In some embodiments, the signal generator may further include a signal divider configured to divide the local oscillation signal into a first local oscillation signal and a second local oscillation signal.

In some embodiments, the signal generator may further include a voltage-controlled oscillator configured to receive a reference signal and to output a vibration signal in response to the reference signal. The local oscillation signal generator may output the local oscillation signal in response to the vibration signal.

In some embodiments, the signal generator may further include a temperature-controlled oscillator, a first switch configured to transmit the reference signal to the voltage-controlled oscillator in a first mode and to transmit an output of the temperature-controlled oscillator to the voltage-controlled oscillator as the reference signal in a second mode, and switches configured to output the vibration signal to an external device in the first mode and to output the vibration signal to the external device through a frequency divider in the second mode.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Embodiments of the present disclosure will now be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
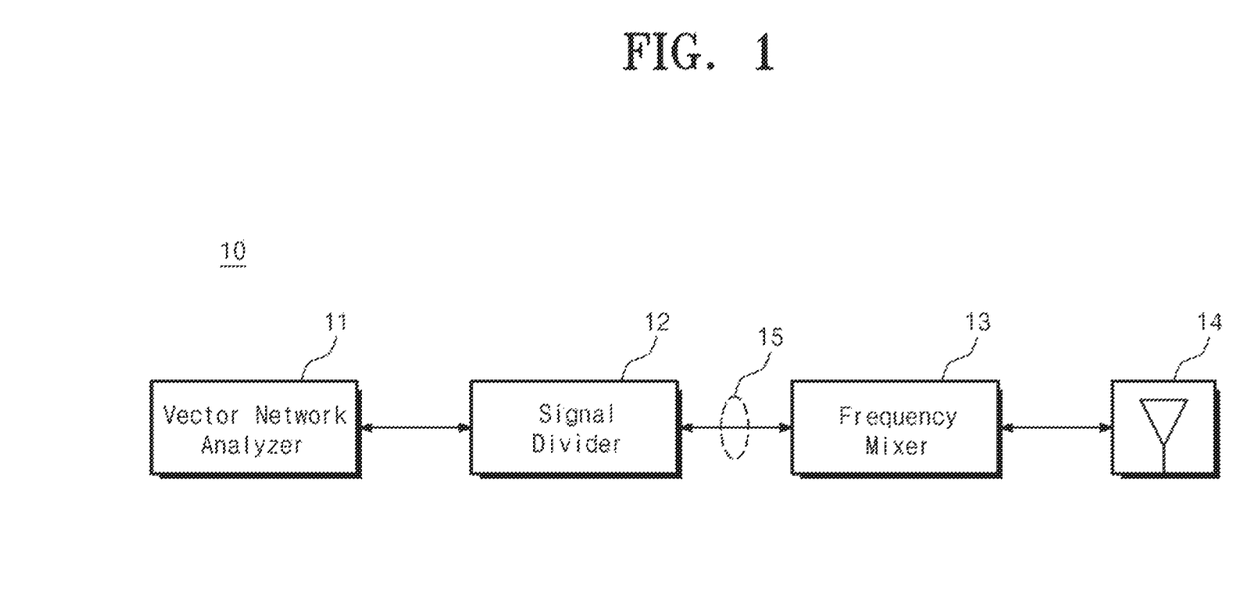
FIG. 1 illustrates a measurement system according to an example.

FIG. 1 illustrates a measurement system 10 according to an example. Referring to FIG. 1, the measurement system 10 includes a vector network analyzer 11, a signal divider 12, a frequency mixer 13, and an antenna 14.

The vector network analyzer 11 may output an electrostatic signal. The signal divider 12 may divide the electrostatic signal to generate various signals, required to measure characteristics of the antenna 14, such as a local oscillation signal, an electromagnetic wave signal, and the like. The divided signals are transmitted to the frequency mixer 13 through a radio-frequency (RF) cable 15 such as a coaxial cable. The frequency mixer 13 may mix various signals, associated with the antenna 14, such as a signal transmitted through the antenna 14, a signal received through the antenna 14, and a signal reflected from the antenna 14, with the divided signals. A result of the mixing is transmitted to the vector network analyzer 11. The vector network analyzer 11 may measure (or detect) the characteristics of the antenna 14 based on the result of the mixing.

Conventionally, the frequency mixer 13 is disposed adjacent to the antenna 14, and the signal divider 12 is disposed adjacent to the vector network analyzer 11. Accordingly, as a distance between the vector network analyzer 11 and the antenna 14 is increased, a distance between the signal divider 12 and the frequency mixer 13 is increased and a length of the RF cable 15 is increased. When the length of the RF cable 15 is increased, an influence of signal attenuation, occurring in the RF cable 15, may be increased. That is, levels of signals, reaching the frequency mixer 13, may be reduced and the characteristics of the antenna 14 may not be measured normally.

Figure 2:
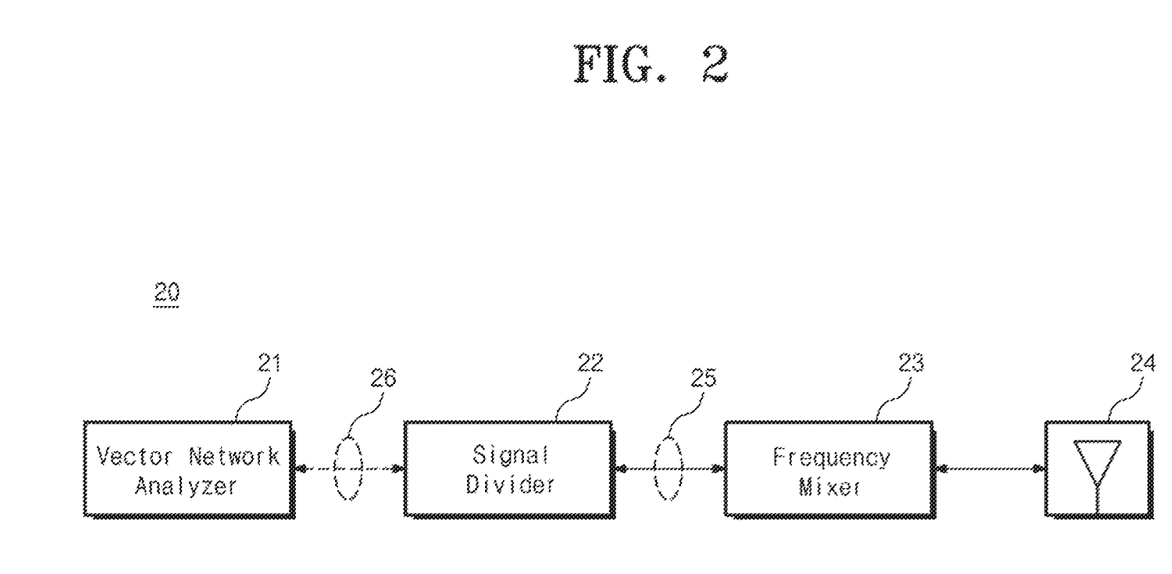
FIG. 2 illustrates a measurement system according to another example.

FIG. 2 illustrates a measurement system 20 according to another example. Referring to FIG. 2, the measurement system 20 includes a vector network analyzer 21, a signal generator 22, a frequency mixer 23, and an antenna 24. Compared with the measurement system 20 in FIG. 1, instead of the signal divider 12, the signal generator 22 is provided.

A communications channel 26 between the vector network analyzer 21 and the signal generator 22 may be based on Ethernet. Accordingly, the vector network analyzer 21 may be disposed adjacent to the antenna 24 and the frequency mixer 23 irrespective of a distance from the vector network analyzer 21. As a result, a length of a radio-frequency (RF) cable 25 between the signal generator 22 and the frequency mixer 23 may be decreased, and attenuation of levels of signals, reaching the frequency mixer 23, may be prevented.

However, most of experimental products of the vector network analyzer 21 and experimental products of the signal generator 22 are incompatible each other in command system and signal system. For example, when a specific vector network analyzer is used, other than a signal generator using the same command and signal systems, other low-cost signal generators cannot be used in the measurement system 20. Even when the measurement system 20 is configured using a vector network analyzer and a signal generator having different command or signal systems to each other, performance of a vector network analyzer and a signal generator is suppressed rather than being fully utilized. To address such an issue, embodiments of the present disclosure provide a signal generator, having a command system and a signal system compatible with various vector network analyzers and generating various signals required to measure characteristics of antennas using the command system and the signal system, and a measurement system including the signal generator.

Figure 3:
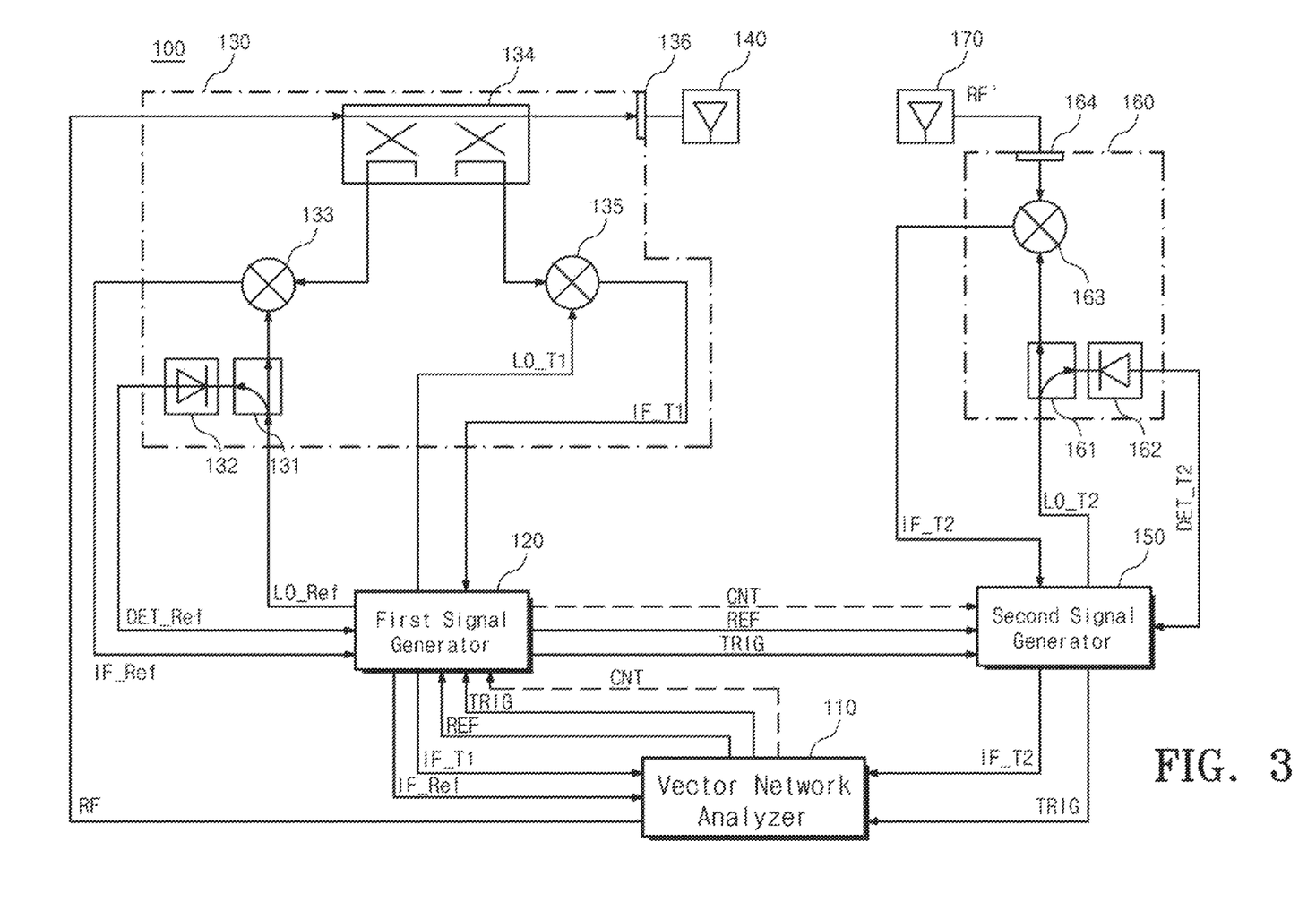
FIG. 3 illustrates an example of a measurement system according to an embodiment of the present disclosure.

FIG. 3 illustrates an example of a measurement system 100 according to an embodiment of the present disclosure. Referring to FIG. 3, the measurement system 100 includes a vector network analyzer 110, a first signal generator 120, a second expansion module 130, a first antenna 140, a second signal generator 150, a second expansion module 160, and a second antenna 170.

The vector network analyzer 110 may output an electromagnetic wave signal RF and a reference signal REF. The electromagnetic wave signal RF may be a signal to be transmitted through the first antenna 140. For example, the electromagnetic wave signal RF may have a frequency of several to several tens of gigahertz (GHz). The electromagnetic wave signal RF may be transmitted to the first expansion module 130. The reference signal REF may be a signal used as a reference on which the first and second signal generators 120 and 150 generate various signals. The reference signal REF may have a frequency of 10 megahertz (MHz). The reference signal REF may be transmitted to the first signal generator 120.

The vector network analyzer 110 may receive a reference intermediate frequency signal IF_Ref and a first test intermediate frequency signal IF_T1 from the first signal generator 120, and may receive a second test signal IF_T2 from the second signal generator 150. The reference intermediate frequency signal IF_Ref may exhibit characteristics of the electromagnetic wave signal RF. The first test intermediate frequency signal IF_T1 may exhibit characteristics of the first antenna 140. The second test intermediate frequency signal IF_T2 may exhibit characteristics of the second antenna 170. The vector network analyzer 110 compares the first and second test intermediate frequency signals IF_T1 and IF_T2 with the reference intermediate frequency signal IF_Ref to measure (or detect) characteristics of the first and second antennas 140 and 170.

The vector network analyzer 110 may be connected to the first signal generator 120 through a control channel CNT. The vector network analyzer 110 may transmit the command and the list of the frequencies for the tests of the first antenna 140 to the first signal generator 120 through the control channel CNT. For example, the control channel CNT may be based on Ethernet.

The vector network analyzer 110 may transmit a trigger signal TRIG to the first signal generator 120. The trigger signal TRIG may include an additional hardware signal line separate from the control channel CNT. The trigger signal TRIG may be a signal requesting a change in a frequency to be tested.

The first signal generator 120 receives the reference signal REF from the vector network analyzer 100. The first signal generator 120 may generate a reference local oscillation signal LO_Ref and a first test local oscillation signal LO_T1 from the reference signal REF. The reference local oscillation signal LO_Ref and the first test local oscillation signal LO_T1 are transmitted to the first expansion module 130.

The first signal generator 120 receives the reference intermediate frequency signal IF_Ref, the first test intermediate frequency signal IF_T1, and the reference detection signal DET_Ref from the first expansion module 130. The first signal generator 120 may transmit the reference intermediate frequency signal IF_Ref and the first test intermediate frequency signal IF_T1 to the vector network analyzer 110. The first signal generator 120 may adjust levels of the reference local oscillation signal LO_Ref and the first test local oscillation signal LO_T1 using the reference detection signal DET_Ref.

The first signal generator 120 may transmit the reference signal REF received from the vector network analyzer 110 to the second signal generator 150.

The first signal generator 120 may receive the command and the list of the frequencies from the vector network analyzer 110 through the control channel CNT. The first signal generator 120 is connected to the second signal generator 150 through the control channel CNT. The first signal generator 120 may transmit (or relay) the command and the list of the frequencies, received from the vector network analyzer 110, to the second signal generator 150 through the control channel CNT. For example, the control channel CNT may be based on Ethernet.

The first signal generator 120 receives the trigger signal TRIG from the vector network analyzer 110. The first signal generator 120 may change a frequency of the reference local oscillation signal LO_Ref and the first test local oscillation signal LO_T1 in response to the trigger signal TRIG. The first signal generator 120 may transmit the trigger signal TRIG to the second signal generator 150. The trigger signal TRIG may be transmitted through the additional hardware signal line separate from the control channel CNT.

The first expansion module 130 may receive the reference local oscillation signal LO_Ref and the first test local oscillation signal LO_T1 from the first signal generator 120. The first expansion module 130 may mix the reference local oscillation signal LO_Ref with the electromagnetic wave signal RF to output the reference intermediate frequency signal IF_Ref. The first extension module 130 may extract a direct current (DC) component of the reference local oscillation signal LO_Ref and may output the extracted DC component as a reference detection signal DET_Ref. The first extension module 130 may mix a signal, reflected from the first antenna 140, with the first test local oscillation signal LO_T1 and may output the mixed signal to as a first test intermediate frequency signal IF_T1.

The first expansion module 130 includes a first directional coupler 131, a first DC component extractor 132, a first mixer 133, a second directional coupler 134, a second mixer 135, and a first port 136.

The first directional coupler 131 may couple the reference local oscillation signal LO_Ref and may transmit the coupled reference local oscillation signal LO_Ref respectively to the first DC component extractor 132 and the first mixer 133. The first DC component extractor 132 may extract a DC component of an output of the first directional coupler 131 and output the extracted DC component as a reference detection signal DET_Ref.

The first mixer 133 may mix the output of the first directional coupler 131 with an output of the second directional coupler. A result of the mixing may be output as the reference intermediate frequency signal IF_Ref. The second directional coupler 134 may couple the electromagnetic wave signal RF, transmitted to the antenna 140, and may transmit the coupled electromagnetic wave signal RF to the first mixer 133. The second directional coupler 134 may couple the electromagnetic wave signal, reflected from the antenna 140, and may transmit the coupled electromagnetic wave signal to the second mixer 135. The second mixer 135 may mix an output of the second directional coupler 134 with the first test local oscillator signal LO_T1. The result of the mixing may be output as the first test intermediate frequency signal IF_T1.

The first port 136 may be a port to which the first antenna 140 is connected.

As described with reference to the first expansion module 130, the reference detection signal DET_Ref represents a DC component of the reference local oscillation signal LO_Ref transmitted to the first mixer 130. The first signal generator 120 may determine attenuation of a cable (for example, a coaxial cable), through which the reference local oscillation signal LO_Ref or the first test local oscillation signal LO_T1, from a difference between a DC component when the reference local oscillation signal LO_Ref is output and a DC component represented by the reference detection signal DET_Ref. The first signal generator 120 may reflect the determined attenuation to adjust a level of the reference local oscillation signal LO_Ref or the first test local oscillation signal LO_T1.

The reference intermediate frequency signal IF_Ref exhibits characteristics of the electromagnetic wave signal RF. The first test intermediate frequency signal IF_T1 represents a component of the electromagnetic wave signal RF reflected from the first antenna 140. Accordingly, the vector network analyzer 110 may determine the characteristics of the first antenna 140 using the reference intermediate frequency signal IF_Ref and the first test intermediate frequency signal IF_T1.

The reference signal REF has a frequency of about 10 MHz. The reference intermediate frequency signal IF_Ref is a result of mixing the electromagnetic wave signal RF with the reference local oscillation signal LO_Ref. For example, the reference intermediate frequency signal IF_Ref may have a frequency in which a frequency of the electromagnetic wave signal RF is reduced by a frequency of the reference local oscillation signal LO_Ref. The frequency of the reference intermediate frequency signal IF_Ref may be lower than the frequency of the electromagnetic wave signal RF or the reference local oscillation signal LO_Ref. Similarly, the frequency of the first test intermediate frequency signal IF_T1 is lower than the frequency of the electromagnetic wave signal RF or the first test local oscillation signal IF_T1. Accordingly, attenuation of the reference signal REF, the reference intermediate frequency signal IF_Ref, and the first test intermediate frequency signal IF_T1 experienced within the cable may less than attenuation of the electromagnetic wave signal RF, the reference local oscillation signal LO_Ref, or the first test local oscillation signal LO_T1 experienced in within the cable. The trigger signal TRIG may not be a high-frequency signal. The control channel CNT may be based on Ethernet. Signals, exchanged between the vector network analyzer 110 and the first signal generator 120, is less affected by a distance between the vector network analyzer 110 and the first signal generator 120 than other high-frequency signals.

The second signal generator 150 receives the reference signal REF from the first signal generator 120. The second signal generator 150 may generate a second test local oscillation signal LO_T2 from the reference signal REF. The second test local oscillation signal LO_T2 is transmitted to the second expansion module 160.

The second signal generator 150 receives the second test intermediate frequency signal IF_T1 and the test detection signal DET_T2 from the second extension module 160. The second signal generator 150 may transmit the second test intermediate frequency signal IF_T2 to the vector network analyzer 110. The second signal generator 150 may adjust the level of the second test local oscillation signal LO_T2 using the test detection signal DET_T2.

The second signal generator 150 may receive the command and the list of the frequencies from the first signal generator 120 through the control channel CNT.

The second signal generator 150 receives the trigger signal TRIG from the first signal generator 120. The second signal generator 150 may change the frequency of the second test local oscillation signal LO_T2 in response to the trigger signal TRIG. The second signal generator 150 may transmit the trigger signal TRIG to the vector network analyzer 110. The trigger signal TRIG may be transmitted through an additional hardware signal line separate from the control channel CNT.

The second expansion module 160 may receive the second test local oscillation signal LO_T2 from the second signal generator 150. The second expansion module 160 may extract the DC component of the second test local oscillation signal LO_T2 and may output the extracted DC component as a test detection signal DET_T2. The second expansion module 160 may mix an electromagnetic wave signal RF' that the electromagnetic wave signal RF is received through the second antenna 170 with the second test local oscillation signal LO_T2 and may output the received electromagnetic wave signal RF' as a second test intermediate frequency signal IF_T2.

The second expansion module 160 includes a third directional coupler 161, a second direct current (DC) component extractor 162, a third mixer 163, and a second port 164.

The third directional coupler 161 may couple the second test local oscillation signal LO_T2 and may transmit the coupled second test local oscillation signal LO_T2 respectively to the second DC component extractor 162 and the third mixer 163. The second DC component extractor 162 may extract a DC component of an output of the third directional coupler 161 and may output the extracted DC component as a test detection signal DET_T2.

The third mixer 163 may mix the output of the third directional coupler 161 with the received electromagnetic wave signal RF. The result of the mixing may be output as a second test intermediate frequency signal IF_T2.

The second port 164 may be a port to which the second antenna 170 is connected.

As described with reference to the second expansion module 160, the test detection signal DET_T2 represents the DC component of the second test local oscillation signal LO_T2 transmitted to the second mixer 160. The second signal generator 150 may determine attenuation of a cable (for example, a coaxial cable), through which the second test local oscillation signal LO_T1 is transmitted between the second signal generator 150 and the second expansion module 160, from a difference between the DC component when the second test local oscillation signal LO_T2 is output and the DC component represented by the test detection signal DET_T2. The second signal generator 150 may reflect the determined attenuation to adjust a level of the second test local oscillation signal LO_T2.

Figure 4:
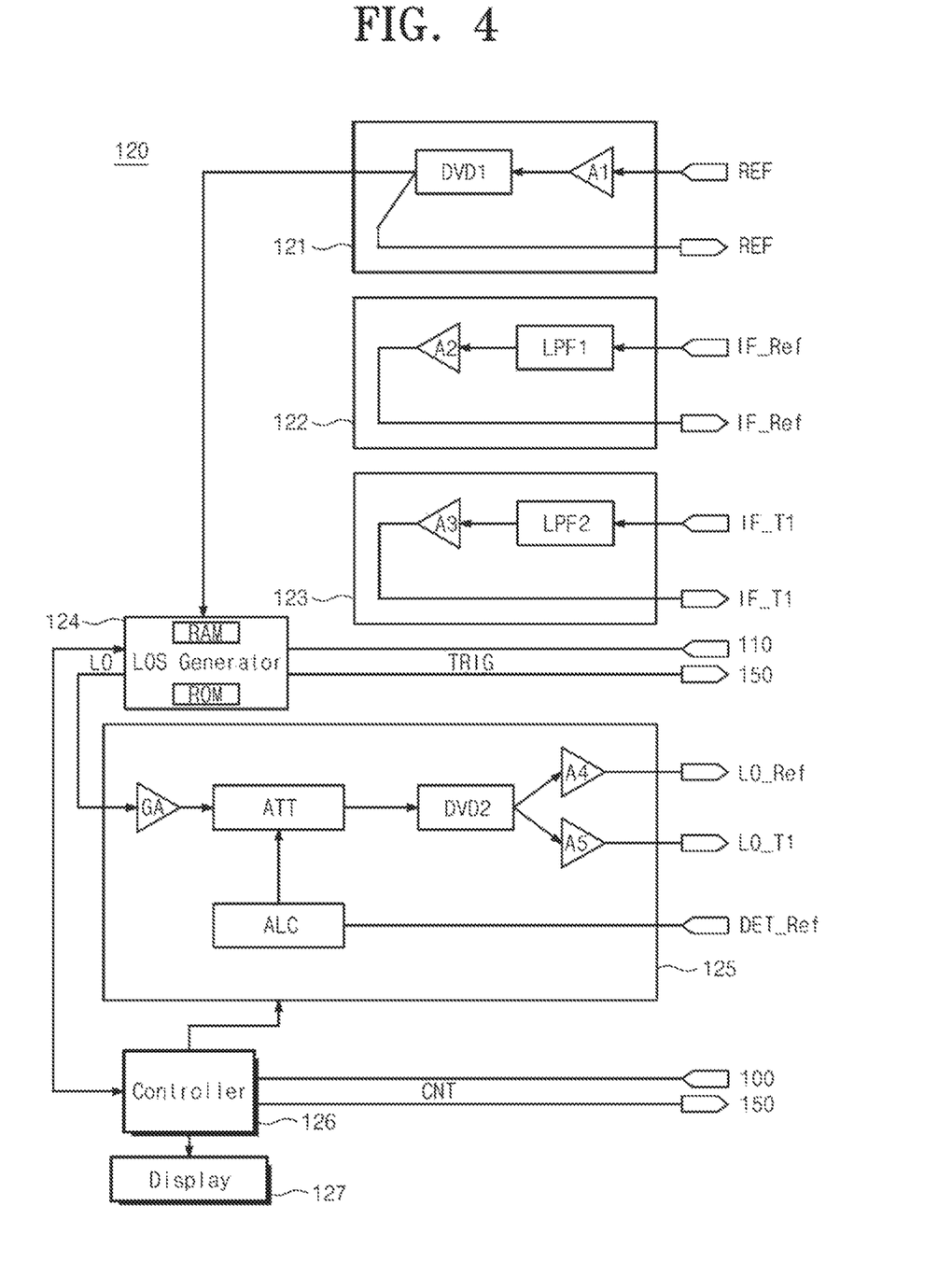
FIG. 4 illustrates an example of a first signal generator according to an embodiment of the present disclosure.

FIG. 4 illustrates an example of a first signal generator 120 according to an embodiment of the present disclosure. Referring to FIGS. 3 and 4, the first signal generator 120 includes first to third signal processing units 121 to 123, a local oscillation signal generator 124, an attenuation processing unit 125, a controller 126, and a display 127.

The first signal processing unit 121 may process a reference signal REF. The first signal processing unit 121 includes a first amplifier A1 and a first signal divider DVD1. The first amplifier A1 may amplify the reference signal REF received from the vector network analyzer 110. The first signal divider DVD1 may transmit an output of the first amplifier A1 respectively to the local oscillator signal generator 124 and the second signal generator 150. For example, the first signal divider DVD1 may be a directional coupler or a power divider.

The second signal processing unit 122 may process a reference intermediate frequency signal IF_Ref. The second signal processing unit 122 includes a first low-pass filter LPF1 and a second amplifier A2. The second low-pass filter LPF1 may perform low-pass filtering on the reference intermediate frequency signal IF_Ref. The second amplifier A2 may amplify an output of the first low-pass filter LPF1 and may transmit the amplified output to the vector network analyzer 110.

The third signal processing unit 123 may process a first test intermediate frequency signal IF_T1. The third signal processing unit 123 includes a second low-pass filter LPF2 and a third amplifier A3. The third low-pass filter LPF3 may perform low-pass filtering on the first test intermediate frequency signal IF_T1. The third amplifier A3 may amplify an output of the second low-pass filter LPF2 and may transmit the amplified output to the vector network analyzer 110.

The local oscillation signal generator 124 receives the reference signal REF from the first signal processing unit 121. The local oscillation signal generator 124 may output a local oscillation signal LO under the control of the controller 126.

The local oscillation signal generator 124 includes a random access memory (RAM) and a read-only memory (ROM). The read-only memory (ROM) may store various codes such as an initialization code of the local oscillation signal generator 124, firmware required to operate the controller 126, and the like. The random access memory (RAM) may store various data generated during operation of the local oscillation signal generator 124. For example, the controller 126 may store a list of frequencies and level compensation values.

The local oscillation signal generator 124 may receive a trigger signal TRIG from the vector network analyzer 110. The local oscillation signal generator 124 may output a local oscillation signal LO, having a frequency different from an initial frequency or a current frequency among the listed frequencies, in response to the trigger signal TRIG. The order of frequencies selected by the trigger signal TRIG may be received from the controller 126 together with the list of frequencies.

The attenuation processing unit 125 may adjust an attenuation rate of the local oscillation signal LO according to the attenuation occurring between the first signal generator 120 and the first expansion module 130. The attenuation processing unit 125 includes a variable gain amplifier GA, a variable attenuator ATT, a second signal divider DVD2, fourth and fifth amplifiers A4 and A5, and attenuation logic ALC.

The variable gain amplifier GA may have a gain varied by the attenuation logic ALC or the controller 126. The variable attenuator ATT may have a variable attenuation rate varying depending on the control of the attenuation logic ALC. The attenuation logic ALC may receive a reference detection signal DET_Ref from the first expansion module 130 and may adjust the attenuation rate of the variable attenuator ATT based on the reference detection signal DET_Ref. The second signal divider DVD2 may divide an output of the variable attenuator ATT and may transmit the divided output respectively to the fourth and fifth amplifiers A4 and A5. For example, the second signal divider DVD2 may be a directional coupler or a power divider. The fourth and fifth amplifiers A4 and A5 may output an output of the second signal divider DVD2 respectively to the reference local oscillation signal LO_Ref and the first test local oscillation signal LO_T1.

The controller 126 is connected respectively to the vector network analyzer 110 and the second signal generator 150 through a control channel CNT. The controller 126 may receive commands from vector network analyzer 110. The controller 126 may convert the commands of the vector network analyzer 110 into internal commands. The controller 126 may transmit responses to the vector network analyzer 110 based on a command scheme of the vector network analyzer 110. The controller 126 may control the local oscillation signal generator 124, the attenuation processing unit 125, and the display 127 based on the converted internal commands. The controller 126 may receive and store a list of frequencies from the vector network analyzer 110. The controller 126 may transmit command and a list of frequencies, transmitted from vector network analyzer 110, to second signal generator 150.

The display 127 is driven by the controller 126 and may display states of the first signal generator 120 and signals processed by the first signal generator 120.

For example, the local oscillation signal generator 124, the attenuation processing unit 125, the controller 126, and the display 127 may be implemented as modules, respectively. The local oscillation signal generator 124, the decay processing unit 125, and the display 127 may be connected to the controller 126 through a universal serial bus (USB) interface. The display 127 may include a touch interface.

As an example, user interface devices such as a keyboard, a mouse, and the like may be additionally connected to the controller 126. For example, the user interface devices may be connected to the controller 126 through the USB interface.

As described above, the controller 126 may communicate with the vector network analyzer 110, having a first command scheme or a first signal scheme, through a first-type, for example, an Ethernet interface. The controller 126 may convert the first command scheme or the first signal scheme into a second command scheme or a second signal scheme. The controller 126 may communicate with at least one of the local oscillation signal generator 124, having the second command scheme or the second signal scheme, the attenuation processing unit 125, and the display 127 through a second-type, for example, a USB interface. By applying the controller 126, the vector network analyzer 110 and the local oscillator signal generator 124, different instruction systems or signaling schemes to each other, may easily provide various signals for test. In particular, the local oscillation signal generator 124 is configured to receive and transmit the trigger signal TRIG, provided as an additional hardware signal line for a rapid change in frequency, to improve test speed.

Additionally, the controller 126 or the local oscillation signal generator 124 may further manage a calibration level for a loss path deviation (for example, a slope) depending on frequencies. The controller 126 or the local oscillation signal generator 124 may calculate the calibration level for frequencies, listed in the list, using the slope of corresponding set values.

The second signal generator 150 may be configured similarly to the first signal generator 120 illustrated FIG. 4. For example, except that the first signal distributor DVD1 is removed in the first signal processing unit 120, the second signal divider DVD2 is removed in the attenuation processing unit 125, one of the fourth and fifth amplifiers A4 and A4 is provided, and an output of the control channel CNT is removed, the second signal processing unit 150 may have the same structure as the first signal processing unit 120.

As another example, the second signal processing unit 150 has the same configuration as the first signal processing unit 120, and an output port of the reference signal REF, one of two output ports of the attenuation processing unit 125, and an output port of the control channel CNT may be deactivated.

Figure 5:
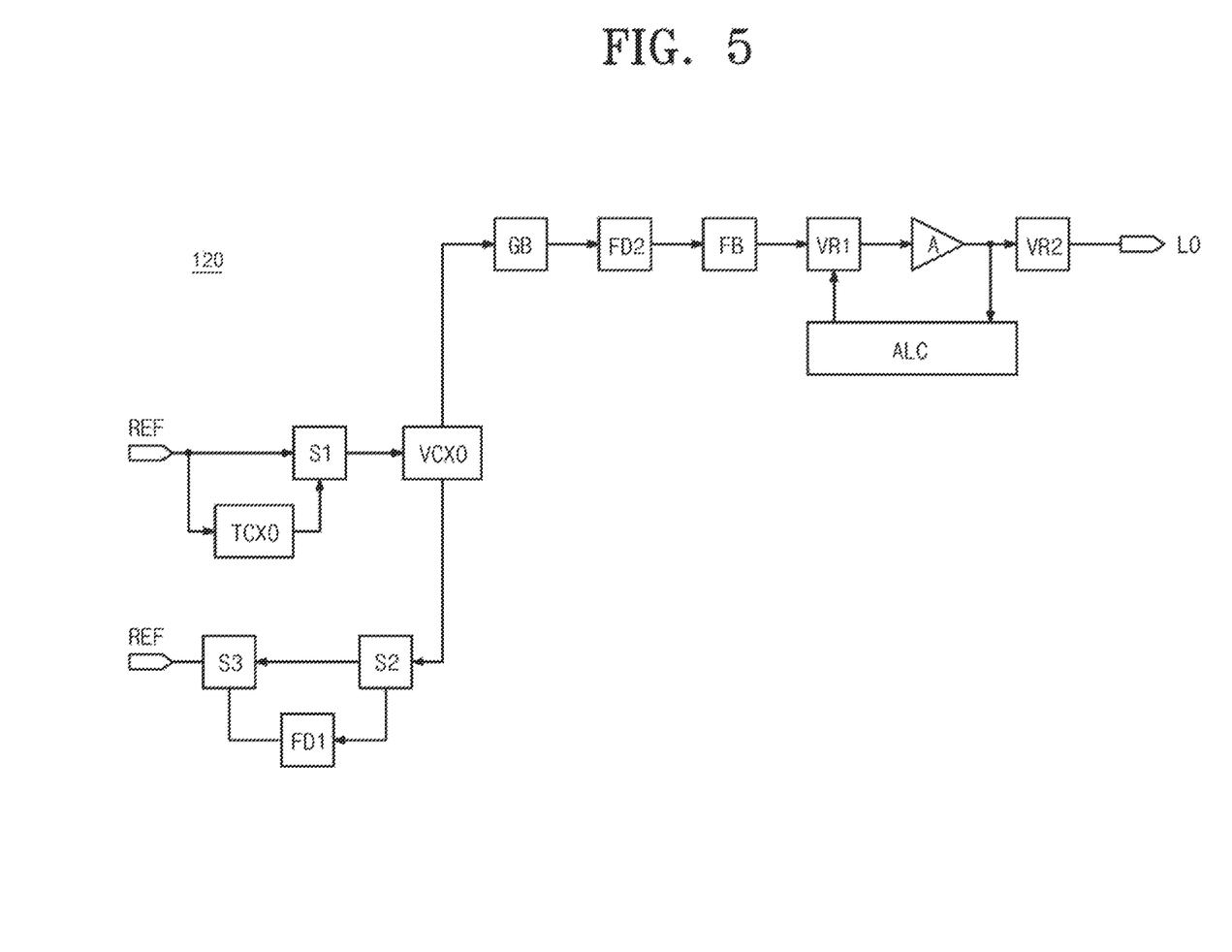
FIG. 5 illustrates an example of blocks associated with a local oscillation signal generator in the first signal generator.

FIG. 5 illustrates an example of blocks associated with the local oscillation signal generator 124 in the first signal generator 120. Referring to FIGS. 4 and 5, the first signal generator 120 includes first to third switches, first and second frequency dividers FD1 and FD2, a temperature-controlled oscillator TCXO, a voltage-controlled oscillator VCXO, a generation block GB, a filter bank FB, first and second variable resistors VB1 and VB2, an amplifier A, and an attenuation logic ALC.

The reference signal REF may be transmitted to the temperature-controlled oscillator TCXO and a first switch S1. The first switch S1 may transmit the reference signal REF or an output of the temperature-controlled oscillator TCXO to the voltage-controlled oscillator VCXO in response to the control of the controller 126. For example, the first switch S1 and the temperature-controlled oscillator TCXO may be optionally added to the first signal processing unit 121 in FIG. 4.

The output of the voltage-controlled oscillator VCXO is transmitted to the generation block GB and the second switch S2. The second switch transmits the output of the voltage-controlled oscillator S2 to one of the third switch S3 and the first frequency divider FD1 under the control of the controller 126. For example, the first frequency divider may have a division ratio of 1/10. The third switch S3 may output one of an output of a second switch S2 and an output of the first frequency divider FD1 to the second signal generator 150 (see FIG. 3) under the control of the controller 126. The second and third switches S2 and S3 and the first frequency divider FD1 may be optionally provided to the first signal processor 121 in FIG. 4.

The voltage-controlled oscillator VCXO may correspond to the first signal divider DVD1 of the first signal processing unit 121 in FIG. 4.

The generation block GB may perform coarse tuning and fine tuning on the output of the voltage controlled oscillator VCXO to generate a signal having a frequency of 10 GHz to 20 GHz band. For example, the coarse tuning may include phase locking and harmonic wave generation. The fine tuning may include modulus direct digital synthesis (DDS).

The second frequency divider FD2 may divide a frequency of the output signal of the generation block GB by 1/N. A division ratio of the second frequency divider FD2 may be controlled by the controller 126. The division ratio of the second frequency divider FD2 may be determined depending on a target frequency among the frequencies listed in the list. The filter bank FB may filter an output of the second frequency divider FD2 in a required band. A pass band and a stop band of the filter bank FB may be controlled by the controller 126. The pass band and the stop band of the filter bank FB may be determined depending on the target frequency among the frequencies listed in the list.

A resistance of the first variable resistor VR1 may be adjusted by the attenuation logic ALC. An output signal of the filter bank FB is transmitted to the amplifier A through the first variable resistor VR1. When the resistance of the first variable resistor VR1 is adjusted by the attenuation logic ALC, an attenuation ratio of a signal, passing through the first variable resistor VR1, may be adjusted. The first variable resistor VR1 and the amplifier A may correspond to the variable attenuator ATT in FIG. 4. The output of the amplifier A is transmitted to the second variable resistor VR2. A resistance of the second variable resistor VR2 may be controlled by the controller 126. The signal, which has passed through the second variable resistor VR2, may be output as a local oscillation signal LO.

Figure 6:
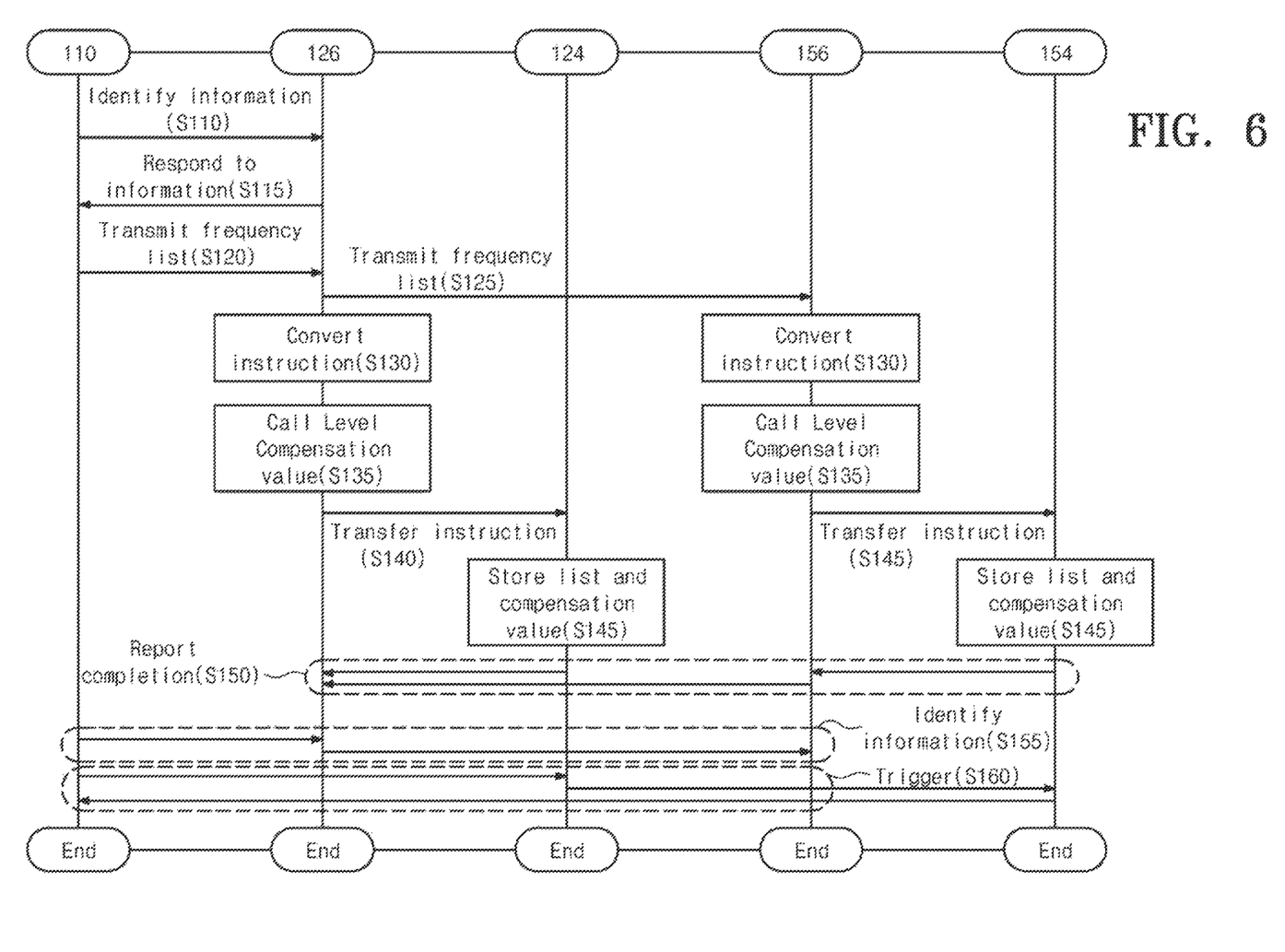
FIG. 6 is a flowchart illustrating an operating method of a measurement system according to an embodiment of the present disclosure.

FIG. 6 is a flowchart illustrating an operating method of a measurement system 100 according to an embodiment of the present disclosure. Referring to FIGS. 3, 4, and 6, in operation S110, the vector network analyzer 110 may request the first signal generator 120 to identify information through the control channel CNT. For example, the vector network analyzer 110 may request information identification depending on the first command scheme.

In operation S115, the controller 126 of the first signal generator 120 may transmit an information response to the vector network analyzer 110 through the control channel CNT according to the first command scheme. When the information response is received, the vector network analyzer 110 may identify that the first signal generator 120 operates according to the first command scheme. In operation S120, the vector network analyzer 110 may transmit a frequency list to the first signal generator 120 through the control channel CNT. The controller 126 of the first signal generator 120 may store a frequency list. In operation 125, the controller 126 of the first signal generator 120 may transmit the frequency list to the controller (for example, the controller 156) of the second signal generator 150 through the control channel CNT. The controller 156 of the second signal generator 150 may store the frequency list.

In operation S130, each of the controller 126 of the first signal generator 120 and the controller 156 of the second signal generator 150 may perform instruction conversion. For example, the controller 126 may generate instructions, transmitted from the vector network analyzer 110 through the control channel CNT, and second-type instructions for controlling the local oscillation signal generator 124 based on the stored frequency list. The controller 156 may generate instructions, transmitted from the first signal generator 120 through the control channel CNT, and second-type instructions for controlling a local oscillation signal generator (for example, the local oscillation signal generator 156) based on the stored frequency list.

In operation S135, the controller 126 of the first signal generator 120 and the controller 156 of the second signal generator 150 may call level compensation values. For example, the level compensation values may be prestored in the controllers 126 and 156, received together with the frequency list, or calculated by the controllers 126 and 156 based on the frequency list.

In operation S140, the controller 126 may transmit the second-type instructions to the local oscillation signal generator 124. The controller 156 may transmit the second-type instructions the local oscillation signal generator 154. For example, the second-type instructions may be transmitted through a USB interface. The instructions may include a frequency lists and level compensation values.

In operation S145, the local oscillation signal generator 124 may store the frequency list and the level compensation values transmitted from the controller 126. The local oscillation signal generator 154 may store the frequency list and level compensation values transmitted from the controller 156.

In operation S150, completion report is performed. For example, the local oscillation signal generator 124 may report to the controller 126 that application of the frequency list and level compensation values was completed. The local oscillation signal generator 154 may report to the controller 156 that the application of the frequency list and level compensation values was completed. The controller 156 may report to the controller 126 that the application of the frequency list and level compensation values was completed. The controller 126 may report to the vector network analyzer 110 that the application of the frequency list and level compensation values has been completed. For example, the completion report may be generated by the vector network analyzer 110 querying the first signal generator 120 whether the application is completed. As another example, the completion report may be performed as the second signal generator 150 reports the completion to the first signal generator 120 and as the first signal generator 120 reports the completion to the vector network analyzer 110.

In operation S155, information identification is performed. For example, an identification may be performed as to whether execution of instructions is completed. The information identification may be performed by the vector network analyzer 110 requesting the first signal generator 120 to make the identification and by the vector network analyzer 110 requesting the first signal generator 120 to make the identification.

In operation S160, triggering is performed. The vector network analyzer 110 may activate the trigger signal TRIG. The local oscillation signal generator 124 may convert a frequency in response to the trigger signal TRIG. The local oscillation signal generator 124 may transmit the trigger signal TRIG to the local oscillation signal generator 154. The local oscillation signal generator 154 may convert a frequency in response to the trigger signal TRIG. The local oscillation signal generator 154 may transmit the trigger signal TRIG to the vector network analyzer 110. The vector network analyzer 110 may measure characteristics of the first and second antennas 140 and 170 using signals transmitted through the first and second signal generators 120 and 150.

Figure 7:
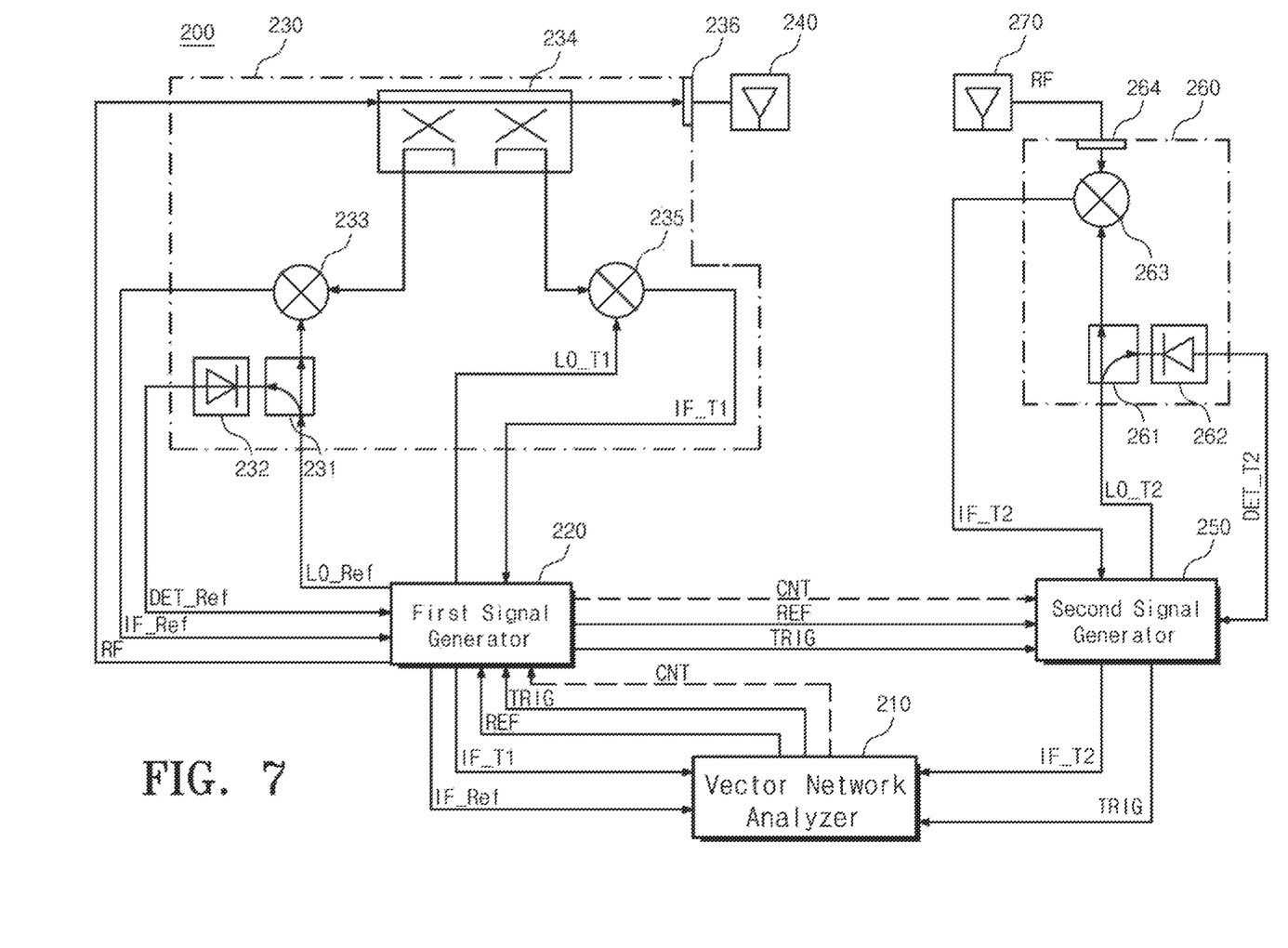
FIG. 7 illustrates an application example of the measurement system in FIG. 3.

FIG. 7 illustrates an application example 200 of the measurement system 100 in FIG. 3. Referring to FIG. 7, the measurement system 200 includes a vector network analyzer 210, a first signal generator 220, a first extension module 230, a first antenna 240, a second signal generator 250, a second expansion module 260, and a second antenna 270. The first expansion module 230 includes a first directional coupler 231, a first direct current (DC) component extractor 232, a first mixer 233, a first directional coupler 234, a second mixer 235, and a first port 264. The second expansion module 260 includes a third directional coupler 261, a second DC component extractor 262, a third mixer 263, and a second port 264.

As compared to the measurement system 100 in FIG. 3, the vector network analyzer 210 does not output an electromagnetic wave signal RF. The first signal generator 220 may generate an electromagnetic wave signal RF from a reference signal REF. The electromagnetic wave signal REF may be generated using a local oscillation signal generator 124 (see FIG. 4) or an addition oscillation signal generator. For example, the electromagnetic wave signal RF may be generated by coupling, multiplying, or dividing a local oscillation signal LO.

Figure 8:
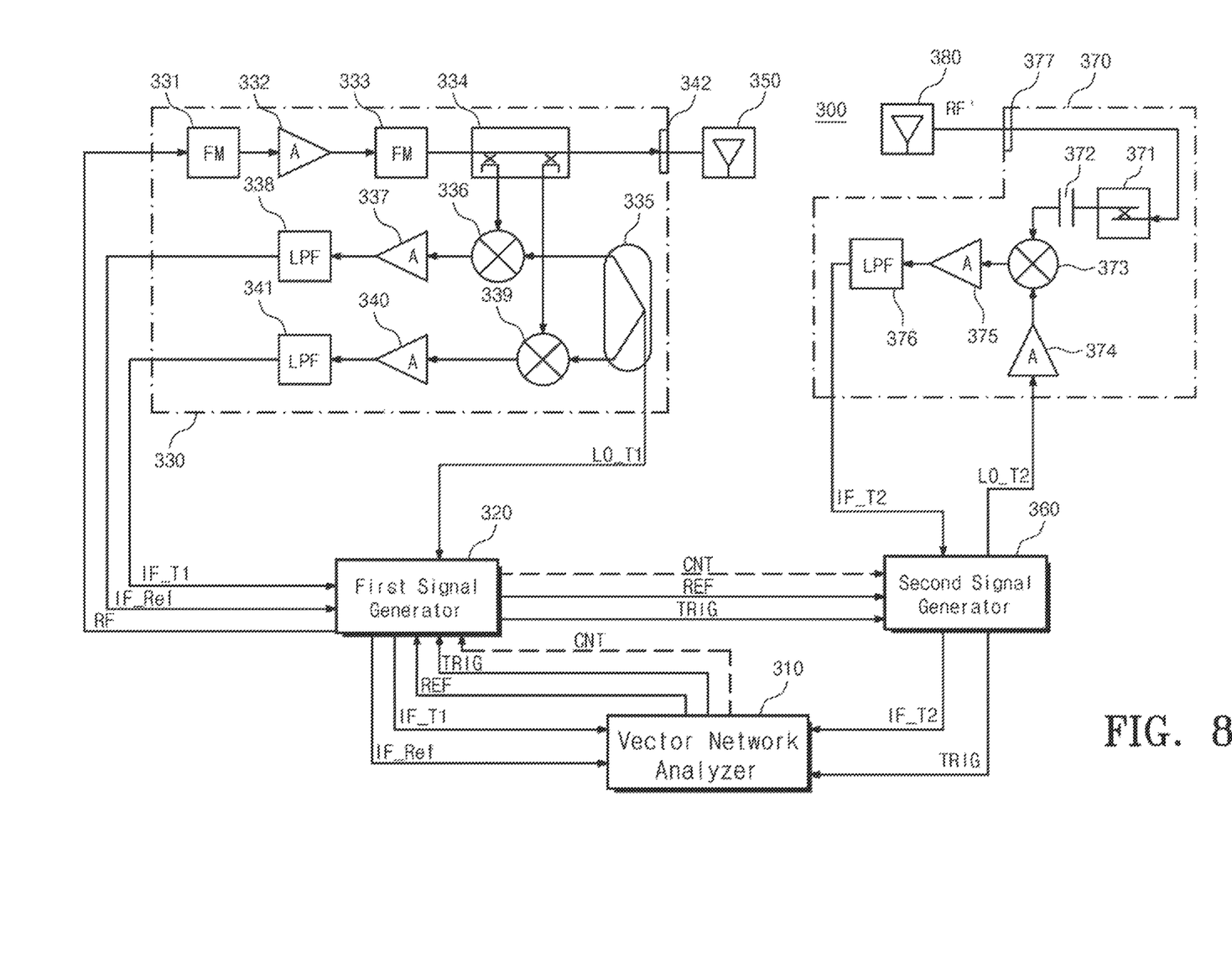
FIG. 8 illustrates another application example of the measurement system in FIG. 3.

FIG. 8 illustrates another application example 300 of the measurement system 100 in FIG. 3. Referring to FIG. 8, the measurement system 300 includes a vector network analyzer 310, a first signal generator 320, a second expansion module 330, a first antenna 350, a second signal generator 360, a second expansion module 370, and a second antenna 380.

As an example, the measurement system 300 may be applied to a millimeter wave. Attenuation, caused by a millimeter-wave cable, is relatively less than attenuation caused by a GHz-wave cable. Accordingly, detection signals DET_Ref and DET_T2 (see FIG. 3) for attenuation application may not be used in the millimeter-wave measurement system 300.

The first extension module 330 includes first and second frequency multipliers 331 and 333, first to third amplifiers 332, 337 and 340, first and second low-pass filters 338 and 341, first and second mixers 336 and 339, a first directional coupler 334, a power divider 335, and a first port.

The first frequency multiplier 331 may multiply a frequency of an electromagnetic wave signal RF output from the first signal generator 320. The first amplifier 332 may amplify an output of the first frequency multiplier 331. The second frequency multiplier 333 may multiply a frequency of an output of the first amplifier 332. The first directional coupler 334 may couple a signal, transmitted from the second frequency multiplier 333 to the antenna 350, and may output the coupled signal to the first mixer 336. The first directional coupler 334 may couple a signal, reflected by the first antenna 350 to be transmitted to the first directional coupler 334, and may transmit the coupled signal to the second mixer 339.

The power divider 335 may divide power of the first test local oscillation signal LO_T1, output from the first signal generator 320, and may transmit the divided power to the first and second mixers 336 and 339. The first mixer 336 may mix an output of the first directional coupler 334 with an output of the power divider 335 and may output the mixture. The second amplifier 337 may amplify an output of the first mixer 336. The first low-pass filter 338 may perform low-pass filtering on the output of the amplifier 337. The output of the first low pass filter 338 may be output as a reference intermediate frequency signal IF_Ref.

The second mixer 339 may mix an output of the power divider 335 with an output of the first directional coupler 334. The third amplifier 340 may amplify an output of the second mixer 339. The second low-pass filter 341 may perform low-pass filtering on an output of the third amplifier 340. An output of the second low-pass filter 341 may be output as a first test intermediate frequency signal IF_T1.

The first port 342 may be a port to which the first antenna 350 is connected.

The second expansion module 370 includes a second directional coupler 371, a capacitor 372, a third mixer 373, a fourth amplifier 374, a fifth amplifier 375, a third low-pass filter 376, and a second port 377.

The first directional coupler 371 may couple a signal RF', received through the antenna 380, and may output the coupled signal RF'. The capacitor 372 may remove a direct current (DC) component. The fourth amplifier 374 may amplify a second test local oscillation signal LO_T2. The third mixer 373 may mix an output of the fourth amplifier 374 with a signal transmitted through the capacitor 372. The fifth amplifier 375 may amplify an output of the third mixer 373. The third low-pass filter 376 may perform low-pass filtering on an output of the fifth amplifier 375. An output of the third low-pass filter 376 may be output as a second test intermediate frequency signal IF_T2.

The second port 377 may be a port to which the second antenna 380 is connected.

As set forth above, according to embodiments of the present disclosure, impedance characteristics of a device connected to a multilayer substrate through a via may be precisely calibrated.

Although the present disclosure and its advantages have been described in detail, it should be understood that various changes, substitutions and alterations can be made herein without departing from the spirit and scope of the disclosure as defined by the following claims.

What is claimed is:

1. A signal generator comprising:
a controller configured to convert commands received from a vector analyzer through a first channel into internal commands, wherein the vector analyzer has a first command scheme or system; and
a local oscillation signal generator configured to generate a local oscillation signal according to the internal commands and to change a frequency of the local oscillation signal in response to a trigger signal received through a second channel, wherein:
the local oscillation signal generator has a second command scheme or system different from, but compatible with, the first command scheme or system,
the controller stores a list of frequencies of the local oscillation signal from the network analyzer, and
the controller controls the local oscillation signal generator based on the internal commands and the stored list of frequencies.

2. The signal generator as set forth in claim 1, further comprising:
a variable attenuator configured to adjust an attenuation rate of the local oscillation signal in response to a detection signal transmitted through a third channel.

3. The signal generator as set forth in claim 1, further comprising:
a signal divider configured to divide the local oscillation signal into a first local oscillation signal and a second local oscillation signal.

4. The signal generator as set forth in claim 1, further comprising:
a voltage-controlled oscillator configured to receive a reference signal and to output a vibration signal in response to the reference signal,
wherein the local oscillation signal generator outputs the local oscillation signal in response to the vibration signal.

5. The signal generator as set forth in claim 4, further comprising:
a temperature-controlled oscillator;
a first switch configured to transmit the reference signal to the voltage-controlled oscillator in a first mode and to transmit an output of the temperature-controlled oscillator to the voltage-controlled oscillator as the reference signal in a second mode; and
switches configured to output the vibration signal to an external device in the first mode and to output the vibration signal to the external device through a frequency divider in the second mode.

6. The signal generator as set forth in claim 1, wherein the first channel is a control channel.

7. The signal generator as set forth in claim 6, wherein the controller further receives the list of the frequencies from the network analyzer through the control channel.

8. The signal generator as set forth in claim 6, wherein the control channel is an Ethernet channel.

9. The signal generator as set forth in claim 8, wherein the second channel comprises a USB interface.

10. The signal generator as set forth in claim 1, wherein the local oscillation signal generator receives the trigger signal from the vector analyzer.

11. The signal generator as set forth in claim 3, wherein the first local oscillation signal is a reference local oscillation signal and the second local oscillation signal is a test local oscillation signal.

12. The signal generator as set forth in claim 1, wherein the local oscillation signal generator changes the frequency of the local oscillation signal from one among the list of frequencies into another one among the list of frequencies in response to the trigger signal, and an order of the frequencies selected by the trigger signal is received from the controller.

13. The signal generator as set forth in claim 1, wherein the local oscillation signal generator comprises:
a random access memory (RAM) that stores data generated during operation of the local oscillation signal generator, and
a read-only memory (ROM) that stores an initialization code of the local oscillation signal generator and firmware that operates the controller.

14. The signal generator as set forth in claim 13, wherein the controller also stores level compensation values.

15. The signal generator as set forth in claim 1, wherein the trigger signal is on a separate signal line, and is configured to improve test speed.

16. The signal generator as set forth in claim 1, wherein signals exchanged between the vector analyzer and the signal generator are less affected by a distance between the vector analyzer and the signal generator than are other high-frequency signals.

17. The signal generator as set forth in claim 1, further comprising:
first, second and third signal processing units, respectively receiving a reference signal from the vector analyzer, a reference intermediate frequency signal from an expansion module, and a test intermediate frequency signal from the expansion module; and
a display configured to display states of the signal generator and signals processed by the signal generator.

18. The signal generator as set forth in claim 17, wherein:
the first signal processing unit includes a first amplifier configured to amplify the reference signal and transmit an output of the first amplifier to the local oscillator signal generator;
the second signal processing unit includes a first low-pass filter and a second amplifier configured to filter and amplify the reference intermediate frequency signal and transmit a first amplified output to the vector analyzer; and
the third signal processing unit includes a second low-pass filter and a third amplifier configured to filter and amplify the test intermediate frequency signal and transmit a second amplified output to the vector analyzer.

19. The signal generator as set forth in claim 1, wherein the controller comprises a USB interface configured to connect one or more user interface devices selected from a keyboard and a mouse to the controller.

20. A signal generator comprising:
a controller configured to convert commands received through a first channel into internal commands;
a voltage-controlled oscillator configured to receive a reference signal and to output a vibration signal in response to the reference signal,
a local oscillation signal generator configured to generate a local oscillation signal according to the internal commands and to change a frequency of the local oscillation signal in response to a trigger signal received through a second channel, wherein the local oscillation signal generator outputs the local oscillation signal in response to the vibration signal;
a temperature-controlled oscillator;
a first switch configured to transmit the reference signal to the voltage-controlled oscillator in a first mode and to transmit an output of the temperature-controlled oscillator to the voltage-controlled oscillator as the reference signal in a second mode; and
switches configured to output the vibration signal to an external device in the first mode and to output the vibration signal to the external device through a frequency divider in the second mode.

* * * * *